US012672314B2

(12) United States Patent
He et al.

(10) Patent No.: US 12,672,314 B2
(45) Date of Patent: Jun. 30, 2026

(54) METAL OXIDE THIN FILM TRANSISTOR, SEMICONDUCTOR DEVICE AND DISPLAY DEVICE

(71) Applicant: BOE Technology Group Co., Ltd., Beijing (CN)

(72) Inventors: Jiayu He, Beijing (CN); Fangqing Wen, Beijing (CN); Ce Ning, Beijing (CN); Hehe Hu, Beijing (CN); Nianqi Yao, Beijing (CN); Kun Zhao, Beijing (CN); Zhengliang Li, Beijing (CN); Jie Huang, Beijing (CN); Feifei Li, Beijing (CN); Yan Qu, Beijing (CN); Liping Lei, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 397 days.

(21) Appl. No.: 18/028,009

(22) PCT Filed: Mar. 30, 2022

(86) PCT No.: PCT/CN2022/084046
§ 371 (c)(1),
(2) Date: Mar. 23, 2023

(87) PCT Pub. No.: WO2023/184231
PCT Pub. Date: Oct. 5, 2023

(65) Prior Publication Data
US 2024/0332425 A1 Oct. 3, 2024

(51) Int. Cl.
*H10D 30/67* (2025.01)
*H10W 90/00* (2026.01)

(52) U.S. Cl.
CPC ........ *H10D 30/6755* (2025.01); *H10W 90/00* (2026.01)

(58) Field of Classification Search
CPC .............. H10D 30/6755; H10D 30/67; H10D 30/6757; H10D 64/66; H10D 86/423; H10D 86/60; H01L 25/074
See application file for complete search history.

(56) References Cited

U.S. PATENT DOCUMENTS

2005/0186740 A1* 8/2005 Kim ..................... H10B 12/488
257/E21.429
2017/0110570 A1* 4/2017 Hou ..................... H10D 30/673
(Continued)

FOREIGN PATENT DOCUMENTS

CN 106960881 A * 7/2017 ........... H10D 30/031
CN 107331698 A * 11/2017 ......... H01L 27/1225
(Continued)

OTHER PUBLICATIONS

Yao; Ri-hui, CN-108336135-A, Machine Translation (Year: 2018).*
(Continued)

*Primary Examiner* — Jacob Y Choi
*Assistant Examiner* — Grace Cha
(74) *Attorney, Agent, or Firm* — Nath, Goldberg & Meyer; Joshua B. Goldberg

(57) ABSTRACT

The present disclosure provides a metal oxide thin film transistor, a semiconductor device and a display device, belongs to the field of display technology, and can solve a problem that current metal oxide thin film transistors have a poor stability. The metal oxide thin film transistor of the present disclosure includes a substrate and a first metal oxide semiconductor layer on the substrate; a material of the first metal oxide semiconductor layer includes a metal oxide doped with a first metal element, an electronegativity difference value between the first metal element and an oxygen
(Continued)

element is greater than or equal to an electronegativity difference value between a metal element in the metal oxide and the oxygen element.

16 Claims, 3 Drawing Sheets

(56) References Cited

U.S. PATENT DOCUMENTS

2019/0326296 A1* 10/2019 Wang ..................... H10B 12/50
2022/0328681 A1* 10/2022 Nongaillard ......... H10D 64/519

FOREIGN PATENT DOCUMENTS

| CN | 108336135 A | * | 7/2018 | ............. H01L 29/49 |
| CN | 111244117 B | * | 7/2020 | ....... G02F 1/136213 |
| JP | 2015144154 A | | 8/2015 | |

OTHER PUBLICATIONS

Li; Pan, CN-111244117-B, Machine Translation (Year: 2020).*
Song; Zhen, CN-107331698-A, Machine Translation (Year: 2017).*
Chen; Chuan-bao, CN-106960881-A, Machine Translation (Year: 2017).*

* cited by examiner

METAL OXIDE THIN FILM TRANSISTOR, SEMICONDUCTOR DEVICE AND DISPLAY DEVICE

This is a National Phase Application filed under 35 U.S.C. 371 as a national stage of PCT/CN2022/084046, filed Mar. 30, 2022, the content of each of which is hereby incorporated by reference in its entirety.

TECHNICAL FIELD

The present disclosure relates to the field of display technology, and particularly relates to a metal oxide thin film transistor, a semiconductor device and a display device.

BACKGROUND

Metal oxide thin film transistors have shown a gradually increasing market share in a high-end display market due to their relatively high mobility, and metal oxide technology is also considered to be the best possible implementation to replace the existing low temperature polysilicon technology. With the upgrading of display products, the development of metal oxide thin film transistors with ultra-high mobility (the mobility greater than 20 $cm^2/V\cdot s$ and even to 30 $cm^2/V\cdot s$ or 50 $m^2/V\cdot s$) becomes the research and development focus of various panel manufacturers.

The metal oxide semiconductor layer of the existing metal oxide thin film transistor may be formed by adopting a metal oxide material with relatively high mobility, although the mobility of the metal oxide thin film transistor is greatly improved, the existing metal oxide thin film transistor, as a device in a product, is easily influenced by factors such as illumination, a manufacturing process, external water and oxygen and the like in a manufacturing procedure or during being used, and has not high enough stability.

SUMMARY

The present disclosure is directed to at least one of problems of the related art, and provides a metal oxide thin film transistor, a semiconductor device and a display device.

In a first aspect, the present disclosure provides a metal oxide thin film transistor, the metal oxide thin film transistor includes a substrate and a first metal oxide semiconductor layer on the substrate, a material of the first metal oxide semiconductor layer includes a metal oxide doped with a first metal element, an electronegativity difference value between the first metal element and an oxygen element is greater than or equal to an electronegativity difference value between a metal element of the metal oxide and the oxygen element.

In some implementations, the first metal element includes at least one of aluminum, tantalum, niobium, neodymium, zirconium or praseodymium.

In some implementations, the metal oxide includes at least one of indium gallium zinc oxide, indium gallium tin oxide, indium zinc oxide, or indium tin zinc oxide.

In some implementations, a percentage of atomics of the first metal element doped in the first metal oxide semiconductor layer ranges from 0.01% to 10%.

In some implementations, a bond energy between the first metal element and the oxygen element is greater than or equal to 400 KJ/mol.

In some implementations, the first metal oxide semiconductor layer has a hall mobility of 10 $cm^2/V\cdot s$ to 60 $cm^2/V\cdot s$.

In some implementations, a concentration of carriers in the first metal oxide semiconductor layer is greater than or equal to $3.5 \times E^{18}$ $cm^{-3}$.

In some implementations, an etching gradient angle of the first metal oxide semiconductor layer ranges from 40 degrees to 60 degrees.

In some implementations, the metal oxide thin film transistor further includes a first electrode and a second electrode arranged opposite to each other on the substrate, and a gate electrode arranged between the first electrode and the second electrode, the first electrode, the second electrode and the gate electrode are insulated from each other, the metal oxide thin film transistor further includes a contact via hole penetrating through the gate electrode; the first metal oxide semiconductor layer is electrically connected with the first electrode and the second electrode through the contact via hole, and the first metal oxide semiconductor layer and the gate electrode are insulated from each other.

In some implementations, the metal oxide thin film transistor further includes a second metal oxide semiconductor layer on a side, away from the substrate, of the first metal oxide semiconductor layer, and a material of the second metal oxide semiconductor layer includes at least one of indium gallium zinc oxide, indium gallium tin oxide, indium zinc oxide, or indium tin zinc oxide.

In some implementations, the metal oxide thin film transistor further includes a filling layer filled in a gap formed by the first metal oxide semiconductor layer or the second metal oxide semiconductor layer at the contact via hole.

In a second aspect, the present disclosure provides a semiconductor device, the semiconductor device includes a plurality of metal oxide thin film transistors as provided above, the metal oxide thin film transistors are stacked, and the first electrode of each metal oxide thin film transistor is electrically connected to the second electrode of the metal oxide thin film transistor adjacent to said each metal oxide thin film transistor.

In some implementations, the first electrode of each metal oxide thin film transistor and the second electrode of the metal oxide thin film transistor adjacent to said each metal oxide thin film transistor are formed into one piece.

In a third aspect, the present disclosure provides an array substrate, the array substrate includes the metal oxide thin film transistor provided as above or the semiconductor device provided as above.

In a fourth aspect, the present disclosure provides a display device, and the display device includes the array substrate provided as above.

DETAILED DESCRIPTION

Figure 1:
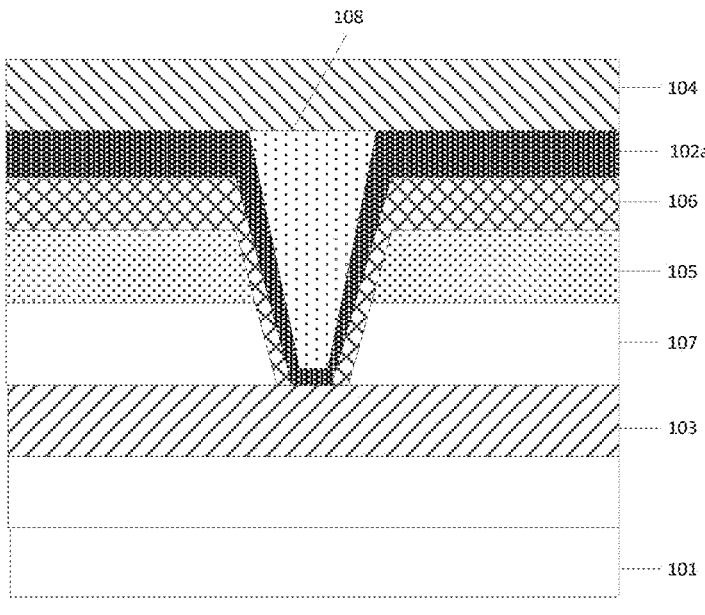
FIG. 1 is a schematic structural diagram of a metal oxide thin film transistor according to the present disclosure.

In order that those skilled in the art will better understand technical solutions of the present disclosure, the following detailed description is given with reference to the accompanying drawings and specific embodiments.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. Terms "upper/on/above", "lower/below/under", "left", "right", and the like are used only to indicate relative positional relationships, and if the absolute position of the object being described is changed, the relative positional relationships may be changed accordingly.

As a novel thin film transistor, the metal oxide thin film transistor can be applied to technologies such as a Liquid Crystal Display (LCD), an Organic Light-Emitting Diode (OLED) display panel, a Mini Light-Emitting Diode (Mini Light-Emitting Diode) backlight or display panel, and a Quantum Dot Light Emitting Diode (QLED) display panel. In the following description, the metal oxide thin film transistor may be applied to any one of display products mentioned above with a same implementation principle, and the implementation principle will not be described in detail repeatedly.

The relatively high mobility of the current metal oxide thin film transistor is mainly determined by characteristics of the material of the metal oxide semiconductor layer, and taking the metal oxide in the metal oxide thin film transistor being indium gallium zinc oxide (IGZO) as an example, the oxygen (O) element and metal elements indium (In), gallium (Ga) and zinc (Zn) can form a compound, and provide or trap carriers (oxygen vacancies) according to a condition of chemical bonding. Indium (In) can provide an electron transport path, so that IGZO has a high mobility. Gallium (Ga) has high ionization energy, and can suppress electron mobility, suppress formation of oxygen vacancies and can generate new mobile electrons. Zinc (Zn) can be used as a stabilizer, has strong chemical bonds to be bound with oxygen ions, and can form a stable tetrahedral structure to form a relatively stable amorphous grain boundary.

As can be seen from characteristics of elements of IGZO in the metal oxide semiconductor layer, the metal oxide thin film transistor including IGZO can have a high mobility, but the material of the metal oxide semiconductor layer in the metal oxide thin film transistor having a high mobility is easily affected by factors such as light, a manufacturing process, and external water and oxygen. In addition, in order to reduce an area occupied by the thin film transistor, the metal oxide thin film transistor may be set as a vertical metal oxide thin film transistor, in a preparation process of a vertical laminated structure, a preparation temperature is generally higher than 350° C., oxygen vacancies are easy to be formed, so that redundant carriers are formed in the metal oxide semiconductor layer, and in such case, a heavily doped region may expand towards a source electrode region and a drain electrode region, a channel is shortened, and problems of threshold voltage shift, sub-threshold slope degradation and the like are easy to be caused.

In order to solve at least one of the above technical problems, the present disclosure provides a metal oxide thin film transistor, a semiconductor device and a display device, and the metal oxide thin film transistor, the semiconductor device and the display device provided by the present disclosure will be described in further detail with reference to implementations and the accompanying drawings.

In a first aspect, an embodiment of the present disclosure provides a metal oxide thin film transistor, and FIG. 1 is a schematic structural diagram of a metal oxide thin film transistor according to the present disclosure, as shown in FIG. 1, the metal oxide thin film transistor includes a substrate 101, a first metal oxide semiconductor layer 102a on the substrate 101, a material of the first metal oxide semiconductor layer 102a includes a metal oxide doped with a first metal element, and an electronegativity difference value between the first metal element and an oxygen element is greater than or equal to an electronegativity difference value between a metal element in the metal oxide and the oxygen element.

The substrate 101 may be made of a rigid material such as glass, which can improve a carrying capacity of the substrate 101 for other film layers thereon. Certainly, the substrate 101 may also be made of a flexible material such as Polyimide (PI), which can improve an overall bending resistance and tensile resistance of the metal oxide thin film transistor, and prevent the substrate 101 from being broken due to a stress generated during the metal oxide thin film transistor being bent, stretched or twisted to cause a defect of broken circuit. In practical applications, the material of the substrate 101 can be selected reasonably as desired, so as to ensure that the metal oxide thin film transistor has good performance.

The metal oxide semiconductor layer of the metal oxide thin film transistor may be formed into a single-layer structure, that is, the metal oxide thin film transistor includes only one first metal oxide semiconductor layer 102a, so that the metal oxide thin film transistor has a simple structure, the difficulty in manufacturing the metal oxide thin film transistor can be reduced, and the manufacturing cost is saved. The first metal oxide semiconductor layer 102a in the metal oxide thin film transistor may be formed of a metal oxide, and particularly, a material of the first metal oxide semiconductor layer 102a includes a metal oxide doped with a first metal element. The metal oxide may have a relatively high mobility to ensure the metal oxide thin film transistor to have a relatively high mobility, so that an electrical performance of the metal oxide thin film transistor can be improved.

In addition, the first metal oxide semiconductor layer 102a is doped with the first metal element, under a limit of 1.7 of the electronegativity difference value, the larger the electronegativity difference value is, the stronger the bond energy of a formed ionic bond is, where the electronegativity difference value between the first metal element and the oxygen (O) element is relatively great, and generally is greater than or equal to the electronegativity difference value between the metal element in the metal oxide and the oxygen (O) element. For example, an electronegativity value of the oxygen (O) element is 3.5, the first metal element with an electronegativity value less than 1.8 may be selected for doping the metal oxide, and an ionic bond with relatively strong bond energy can be formed between the first metal element and the oxygen (O) element, and the bond energy is far greater than the bond energy between the metal element in the original first metal oxide semiconductor layer 102a and the oxygen (O) element, so that the material performance of the first metal oxide semiconductor layer 102a is more stable, and can avoid the influence of factors such as illumination, a manufacturing process, external water and oxygen, and the like, thereby the stability of the structure of the first metal oxide semiconductor layer 102a can be ensured, and thus the stability of the metal oxide thin film transistor can be further improved.

In some implementations, the first metal element includes at least one of aluminum (Al), tantalum (Ta), niobium (Nb), neodymium (Nd), zirconium (Zr), or praseodymium (Pr). The metal oxide includes at least one of Indium Gallium Zinc Oxide (IGZO), Indium Gallium Tin Oxide (IGTO), Indium Zinc Oxide (IZO), or Indium Tin Zinc Oxide (ITZO).

The metal oxide may be at least one of Indium Gallium Zinc Oxide (IGZO), Indium Gallium Tin Oxide (IGTO), Indium Zinc Oxide (IZO), or Indium Tin Zinc Oxide (ITZO), each of which has a relatively high mobility, so as to ensure that the overall metal oxide thin film transistor has a relatively high mobility. The first metal element may be at least one of aluminum (Al), tantalum (Ta), niobium (Nb), neodymium (Nd), zirconium (Zr), or praseodymium (Pr). Taking the metal oxide being Indium Gallium Zinc Oxide (IGZO) and a rare earth element of tantalum (Ta) serving as the first metal element as an example, the electronegativity value of the tantalum (Ta) element is 1.5, the electronegativity value of the oxygen (O) element is 3.5, and under a general limit of 1.7 of the electronegativity difference value, the bond energy of an ionic bond formed by two elements with an electronegativity difference value therebetween greater than 1.7 is relatively strong, and thus the bond energy of the ionic bond formed by the tantalum (Ta) element and the oxygen (O) element is relatively strong, in such way, the material performance of the metal oxide is more stable, and can avoid the influence of factors such as illumination, a manufacturing process, external water and oxygen, thereby the stability of the structure of the first metal oxide semiconductor layer 102a can be ensured, and the overall stability of the metal oxide thin film transistor can be further improved.

Moreover, an ionic radius of tantalum (Ta) is 0.07 nanometers (nm), in response to that tantalum (Ta) is doped into zinc (Zn) oxide or compound oxide of zinc (Zn) and indium (In), the zinc (Zn) is to be replaced by tantalum (Ta), and the lattice structure of the metal oxide is changed little or not changed. Regarding the ionic bond, without considering the binding effect of oxygen ions, since cations have relatively large electron clouds, electron orbitals may overlap, so that a bonding structure is rarely provided with relatively weak ionic bonds, which is independent of a crystalline state or an amorphous state, and thus the material performance of the first metal oxide is more stable, and the stability of the metal oxide thin film transistor is further improved.

It is understood that rare earth elements with other electronegativity values, for example, niobium (Nb), neodymium (Nd), zirconium (Zr), praseodymium (Pr), or the like, may also be selected for serving as the first metal element, and certainly, a mixture of metal elements (rare elements) mentioned above may also be used, as long as the electronegativity difference value between the electronegativity value of the rare element (or the mixture) and the electronegativity value of the oxygen (O) element is ensured to be relatively large, so as to ensure that an ionic bond with relatively strong bond energy can be formed between the rare element (or the mixture) and the oxygen (O) element, thereby improving the overall stability of the metal oxide thin film transistor.

In addition, although the aluminum (Al) element is not a rare earth element, the bond energy formed between the aluminum (Al) element and the oxygen (O) element is also relatively large, the bond energy between the aluminum (Al) element and the oxygen (O) element can reach 805, and a stable ionic bond can also be formed, so that the material performance of the metal oxide can be more stable, and can avoid the influence of factors such as illumination, a manufacturing process, external water and oxygen and the like, so that the stability of the structure of the first metal oxide semiconductor layer 102a can be ensured, and the overall stability of the metal oxide thin film transistor can be improved.

In some implementations, a percentage of atomics of the first metal element doped in the first metal oxide semiconductor layer 102a ranges from 0.01% to 10%.

Taking the first metal element in the first metal oxide semiconductor layer 102a being tantalum (Ta) as an example, the percentage of atomics of tantalum (Ta) ranging from 0.01% to 10% can ensure that an ionic bond with relatively strong bond energy is formed between tantalum (Ta) and oxygen (O), so that the material performance of the first metal oxide is more stable, and is prevented from being affected by factors such as illumination, a manufacturing process, external water and oxygen and the like, thereby ensuring the stability of the first metal oxide semiconductor layer 102a, and further improving the overall stability of the metal oxide thin film transistor.

It should be noted that, in response to that the first metal element is aluminum (Al), niobium (Nb), neodymium (Nd), zirconium (Zr) or praseodymium (Pr), or a mixture of more than one of aluminum (Al), tantalum (Ta), niobium (Nb), neodymium (Nd), zirconium (Zr) or praseodymium (Pr), the percentage of atomics of the first metal element may range from 0.01% to 10%, and the specific value of the percentage may be set as desired.

In some implementations, the percentage of atomics of the first metal element in the first metal oxide semiconductor layer 102a may be 0.15% or 0.2%. In such case, carrier trapping defects can be effectively reduced by suppressing the formation of oxygen vacancies and reducing impurities in the IGZO film layer, so that the material of the metal oxide can be ensured to have relatively strong stability, and the overall stability of the metal oxide thin film transistor is improved.

In some implementations, the bond energy between the first metal element and the oxygen element is greater than or equal to 400 KJ/mol.

The bond energy between the first metal element and the oxygen element is relatively large, specifically, the bond energy between the aluminum (Al) element and the oxygen (O) element may be about 501 KJ/mol, and the bond energy between the tantalum (Ta) element and the oxygen (O) element may be about 501 KJ/mol, which can ensure that an ionic bond having relatively strong bond energy is formed between the first metal element and the oxygen (O) element, so that the material performance of the metal oxide is more stable, and can avoid the influence of factors such as illumination, manufacturing process, external water and oxygen, and the like, thereby ensuring the stability of the first metal oxide semiconductor layer 102a, and further improving the overall stability of the metal oxide thin film transistor.

In some implementations, the first metal oxide semiconductor layer 102a has a hall mobility ranging from 10 cm$^2$/V·s to 60 cm$^2$/V·s.

The hall mobility of the first metal oxide semiconductor layer 102a is relatively high, for example, specifically may be about 50 cm²/V·s, which can ensure that the first metal oxide semiconductor layer 102a has relatively high hall mobility, so as to ensure that the metal oxide thin film transistor as a whole has a relatively high hall mobility.

In some implementations, a concentration of carriers in the first metal oxide semiconductor layer 102a is greater than or equal to 3.5×E18 cm⁻³.

The concentration of carriers in the first metal oxide semiconductor layer 102a is relatively high, for example, specifically may be about 5.0×E18 cm⁻³, which can ensure that the first metal oxide semiconductor layer 102a has the relatively high hall mobility, so as to ensure that the metal oxide thin film transistor as a whole has the relatively high hall mobility.

In some implementations, an etching gradient angle of the first metal oxide semiconductor layer 102a ranges from 40 degrees to 60 degrees.

The etching gradient angle of the first metal oxide semiconductor layer 102a ranges from 40 degrees to 60 degrees, so that, for stacking a plurality of film layers together, the film layers on the first metal oxide semiconductor layer 102a can be effectively supported, and the attaching stability between the plurality of film layers is prevented from being influenced by a too large etching gradient angle or a too small etching gradient angle. Meanwhile, a tailing phenomenon can be avoided, so that the stability of the first metal oxide semiconductor layer 102a is ensured, and the overall stability of the metal oxide thin film transistor can be improved.

In some implementations, as shown in FIG. 1, the metal oxide thin film transistor further includes: a first electrode 103 and a second electrode 104 which are arranged opposite to each other on the substrate 101, and a gate electrode 105 which is arranged between the first electrode 103 and the second electrode 104; the first electrode 103, the second electrode 104 and the gate electrode 105 are insulated from each other; the metal oxide thin film transistor further includes a contact via hole penetrating through the gate electrode 105; the first metal oxide semiconductor layer 102a is electrically connected to the first electrode 103 and the second electrode 104 through the contact via hole, and the first metal oxide semiconductor layer 102a is insulated from the gate electrode 105.

The first electrode 103 may be a source electrode, and the source electrode may be made of at least one material selected from copper (Cu), nickel (Ni), platinum (Pt), palladium (Pd), aluminum (Al), molybdenum (Mo) or chromium (Cr), and may be formed into a single-layer structure made of a single material, for example, a single-layer structure made of aluminum (Al), or may be formed into a multi-layer structure made of multiple different materials, for example, a three-layer structure made of molybdenum (Mo), aluminum (Al), and molybdenum (Mo). In practical applications, a thickness of the first electrode 103 may range from 1000 Å to 10000 Å.

It is understood that other films such as a buffer layer and a barrier layer may be further disposed between the substrate 101 and the first electrode 103, which can prevent water, oxygen, and the like from entering the first metal oxide semiconductor layer 102a from a side where the substrate 101 is located, and the films may be made of materials by processes in the related art, which are not described herein.

The second electrode 104 may be a drain electrode, and the drain electrode may be made of at least one of copper (Cu), nickel (Ni), platinum (Pt), palladium (Pd), aluminum (Al), molybdenum (Mo) or chromium (Cr), and may be formed into a single-layer structure made of a single material, for example, a single-layer structure made of aluminum (Al), or may be formed into a multi-layer structure made of multiple different materials, for example, a three-layer structure made of molybdenum (Mo), aluminum (Al), and molybdenum (Mo). In practical applications, a thickness of the second electrode 104 may range from 1000 Å to 10000 Å.

The gate electrode 105 may be made of at least one material selected from copper (Cu), nickel (Ni), platinum (Pt), palladium (Pd), aluminum (Al), molybdenum (Mo) or chromium (Cr), and may be formed into a single-layer structure made of a single material, for example, a single-layer structure made of aluminum (Al), or may be formed into a multi-layer structure made of multiple different materials, for example, a three-layer structure made of molybdenum (Mo), aluminum (Al), and molybdenum (Mo). In practical applications, a thickness of the gate electrode 105 may range from 1000 Å to 10000 Å.

A gate insulating layer 106 may be disposed between the gate electrode 105 and the first metal oxide semiconductor layer 102a, an interlayer insulating layer 107 may be disposed between the gate electrode 105 and the first electrode 103, and the gate insulating layer 106 and the interlayer insulating layer 107 may be made of at least one of silicon nitride (SiN) or silicon oxide (SiO₂), and may be formed into a single-layer structure made of a single material, or may be formed into a multi-layer structure made of multiple different materials, where a film layer in contact with the first metal oxide semiconductor layer 102a is an SiO₂ layer, which may protect the first metal oxide semiconductor layer 102a, and prevent a short circuit from occurring between the first metal oxide semiconductor layer 102a and other film layers thereon, and a short circuit from occurring between the gate electrode 105 and the first electrode 103, thereby improving the stability of the metal oxide thin film transistor. Specifically, a thickness of each of the gate insulating layer 106 and the interlayer insulating layer 107 may range from 300 Å to 2000 Å.

Figure 2:
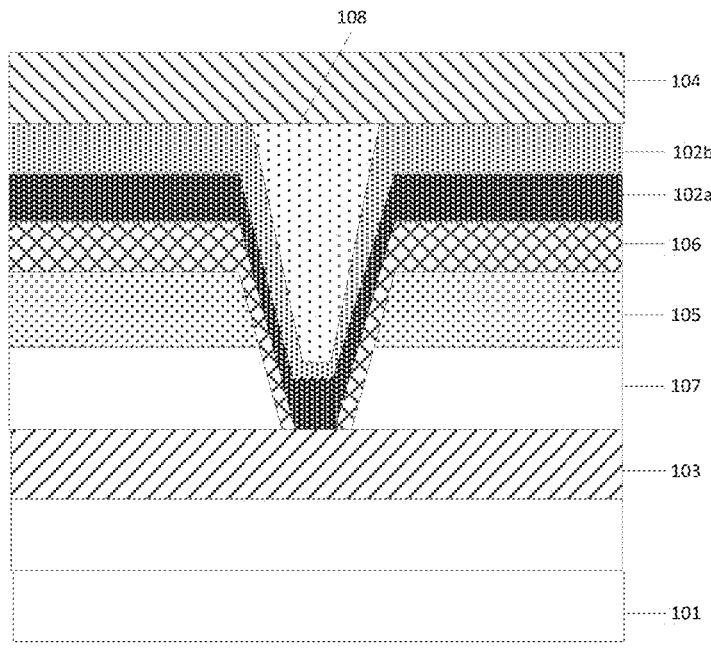
FIG. 2 is a schematic diagram of another metal oxide thin film transistor according to the present disclosure.

In some implementations, FIG. 2 is a schematic structural diagram of another metal oxide thin film transistor according to the present disclosure, and as shown in FIG. 2, the metal oxide thin film transistor further includes a second metal oxide semiconductor layer 102b on a side of the first metal oxide semiconductor layer 102a facing away from the substrate 101; a material of the second metal oxide semiconductor layer 102b includes at least one of indium Gallium Zinc Oxide (IGZO), Indium Gallium Tin Oxide (IGTO), Indium Zinc Oxide (IZO), or Indium Tin Zinc Oxide (ITZO).

The second metal oxide semiconductor layer 102b may be made of a metal oxide material with good stability, for example, at least one of Indium Gallium Zinc Oxide (IGZO), Indium Gallium Tin Oxide (IGTO), Indium Zinc Oxide (IZO), or Indium Tin Zinc Oxide (ITZO), and the second metal oxide semiconductor layer 102b may cover the first metal oxide semiconductor layer 102a to achieve a good light blocking effect, so as to prevent ambient light or light of a light emitting device from directly irradiating the first metal oxide semiconductor layer 102a, thereby achieving a good protection effect on the first metal oxide semiconductor layer 102a, and ensuring that the overall stability of the metal oxide thin film transistor is good.

In some implementations, as shown in FIGS. 1 and 2, the thin film transistor further includes a filling layer 108 filled in a gap formed at the contact via hole of the first metal oxide semiconductor layer 102a or the second metal oxide semiconductor layer 102b.

The filling layer 108 may be made of at least one of silicon nitride (SiN) or silicon oxide (SiO$_2$), and may be formed into a single-layer structure made of a single material or a multi-layer structure made of a plurality of different materials. Since the metal oxide thin film transistors shown in FIG. 1 and FIG. 2 are vertical metal oxide thin film transistors, a certain gap is formed at a position of the contact via hole of the metal oxide semiconductor layer (the first metal oxide semiconductor layer 102a and/or the second metal oxide semiconductor layer 102b), and the filling layer 108 can fill and level up the formed gap to ensure that the surface of the metal oxide semiconductor layer is relatively flat, so that the metal oxide semiconductor layer is in effective contact with the second electrode 104, problems of poor connection and the like are avoided, and the stability of the metal oxide thin film transistor is improved.

Figure 3:
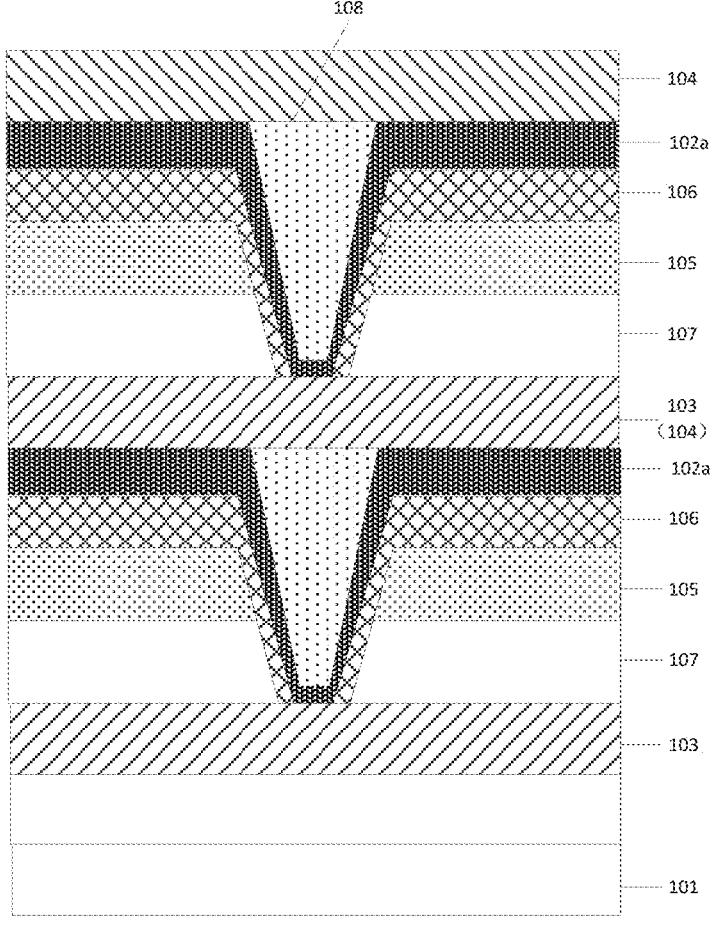
FIG. 3 is a schematic structural diagram of a semiconductor device according to the present disclosure.
Figure 4:
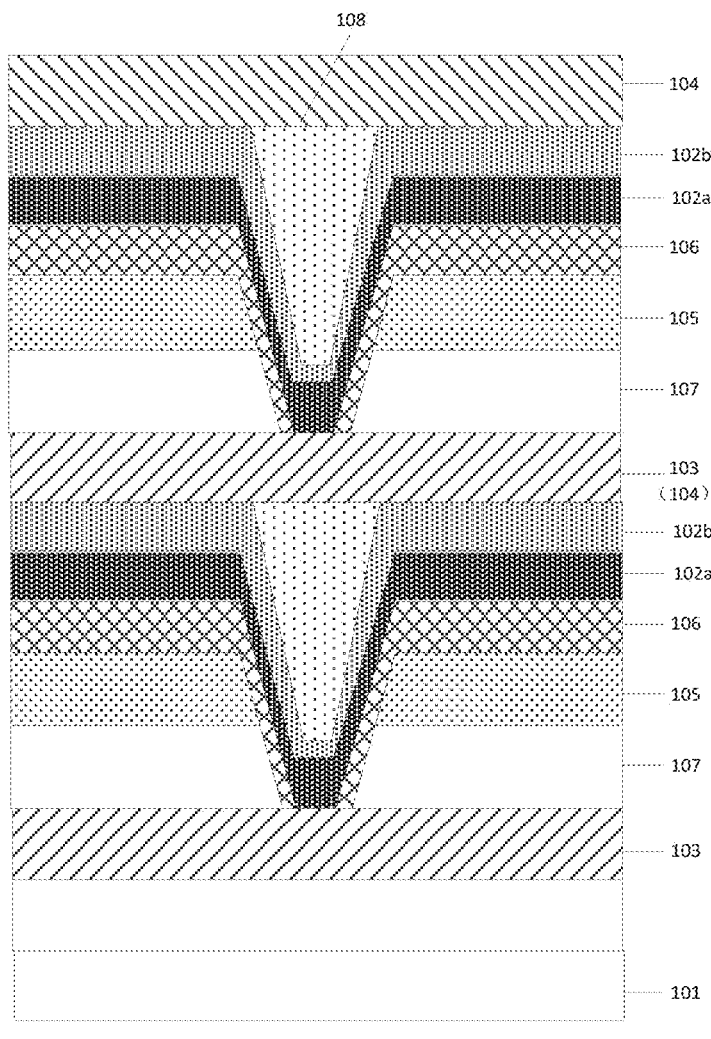
FIG. 4 is a schematic structural diagram of another semiconductor device according to the present disclosure.

In a second aspect, an embodiment of the present disclosure provides a semiconductor device, FIG. 3 is a schematic structural diagram of a semiconductor device according to the present disclosure, and FIG. 4 is a schematic structural diagram of another semiconductor device according to the present disclosure, as shown in FIG. 3 and FIG. 4, the semiconductor device includes a plurality of metal oxide thin film transistors, each of which is that described above, and the plurality of metal oxide thin film transistors are stacked; the first electrode 103 of each metal oxide thin film transistor is electrically connected to the second electrode 104 of the metal oxide thin film transistor adjacent to said each metal oxide thin film transistor.

The plurality of metal oxide thin film transistors are stacked to form the semiconductor device with a cascade structure, so that if the stability of the metal oxide semiconductor layer in any metal oxide thin film transistor is changed, other metal oxide semiconductor layers still can have relatively high stability, and the semiconductor device as a whole is ensured to have good stability.

In some implementations, as shown in FIGS. 3 and 4, the first electrode 103 of each metal oxide thin film transistor and the second electrode 104 of the metal oxide thin film transistor adjacent to said each metal oxide thin film transistor are of an integrally formed structure (i.e., formed into a unitary structure or one piece).

Any two adjacent metal oxide thin film transistors form a cascade structure, and the first electrode 103 of one of the metal oxide thin film transistors and the second electrode 104 of the other metal oxide thin film transistor are of an integrally formed structure (i.e., formed into a unitary structure or one piece), so that process steps can be reduced, the preparation material can be saved, and the preparation cost can be reduced.

In a third aspect, an embodiment of the present disclosure provides an array substrate including the metal oxide thin film transistor described above or the semiconductor device described above, and the implementation principle and the beneficial effects of the array substrate are the same as those of the metal oxide thin film transistor and the semiconductor device, and will not be described again.

In a fourth aspect, an embodiment of the present disclosure provides a display device including the array substrate described above, the display device may be any product or component with a display function, such as a mobile phone, a tablet computer, a television, a display, a notebook computer, a digital photo frame, a navigator, or the like, and the implementation principle and the beneficial effects of the display device are the same as those of the metal oxide thin film transistor and the array substrate, and will not be described again.

It will be understood that the above embodiments are merely exemplary embodiments employed to illustrate the principles of the present disclosure, and the present disclosure is not limited thereto. It will be apparent to those skilled in the art that various changes and modifications can be made without departing from the spirit and scope of the present disclosure, and these changes and modifications are to be considered within the scope of the present disclosure.

The invention claimed is:

1. A metal oxide thin film transistor, comprising: a substrate and a first metal oxide semiconductor layer on the substrate;

a material of the first metal oxide semiconductor layer comprises a metal oxide doped with a first metal element, wherein an electronegativity difference value between the first metal element and an oxygen element is greater than or equal to an electronegativity difference value between a metal element in the metal oxide and the oxygen element, wherein the metal oxide thin film transistor further comprises a first electrode and a second electrode arranged opposite to each other on the substrate, and a gate electrode arranged between the first electrode and the second electrode, the first electrode, the gate electrode, the first metal oxide semiconductor layer and the second electrode are sequentially stacked in a direction away from the substrate; the first electrode, the second electrode and the gate electrode are insulated from each other; the metal oxide thin film transistor further includes a contact via hole penetrating through the gate electrode;

the first metal oxide semiconductor layer is electrically connected with the first electrode and the second electrode through the contact via hole, and the first metal oxide semiconductor layer and the gate electrode are insulated from each other.

2. The metal oxide thin film transistor of claim 1, wherein the first metal element comprises at least one of aluminum, tantalum, niobium, neodymium, zirconium or praseodymium.

3. The metal oxide thin film transistor of claim 1, wherein the metal oxide comprises at least one of indium gallium zinc oxide, indium gallium tin oxide, indium zinc oxide, or indium tin zinc oxide.

4. The metal oxide thin film transistor of claim 1, wherein a percentage of atomics of the first metal element doped in the first metal oxide semiconductor layer ranges from 0.01% to 10%.

5. The metal oxide thin film transistor of claim 1, wherein a bond energy between the first metal element and the oxygen element is greater than or equal to 400 KJ/mol.

6. The metal oxide thin film transistor of claim 1, wherein the first metal oxide semiconductor layer has a hall mobility ranging from 10 cm2/V·s to 60 cm2/V·s.

7. The metal oxide thin film transistor of claim 1, wherein a concentration of carriers in the first metal oxide semiconductor layer is greater than or equal to 3.5×E18 cm-3.

8. The metal oxide thin film transistor of claim 1, wherein an etching gradient angle of the first metal oxide semiconductor layer ranges from 40 degrees to 60 degrees.

9. The metal oxide thin film transistor of claim 1, further comprising a second metal oxide semiconductor layer on a side, away from the substrate, of the first metal oxide semiconductor layer;

a material of the second metal oxide semiconductor layer comprises at least one of indium gallium zinc oxide, indium gallium tin oxide, indium zinc oxide, or indium tin zinc oxide.

10. The metal oxide thin film transistor of claim 9, further comprising a filling layer filled in a gap formed by the first metal oxide semiconductor layer or the second metal oxide semiconductor layer at the contact via hole.

11. A semiconductor device, comprising: a plurality of metal oxide thin film transistors, each of which is the metal oxide thin film transistor of claim 1, the metal oxide thin film transistors are stacked; the first electrode of each metal oxide thin film transistor is electrically connected to the second electrode of the metal oxide thin film transistor adjacent to said each metal oxide thin film transistor.

12. The semiconductor device of claim 11, wherein the first electrode of each metal oxide thin film transistor and the second electrode of the metal oxide thin film transistor adjacent to said each metal oxide thin film transistor are formed into one piece.

13. An array substrate, comprising: the metal oxide thin film transistor of claim 1.

14. A display device, comprising: the array substrate of claim 13.

15. An array substrate, comprising: the semiconductor device of claim 11.

16. A display device, comprising: the array substrate of claim 15.

* * * * *